United States Patent
Abe et al.

[11] Patent Number: 6,094,236
[45] Date of Patent: Jul. 25, 2000

[54] TUNER CIRCUIT

[75] Inventors: Shuji Abe; Hideki Oto, both of Saitama-ken; Toshimasa Adachi, Kanagawa-ken; Katsuya Kudo, Saitama-ken, all of Japan

[73] Assignee: Kabushiki Kaisha Toshiba, Kawasaki, Japan

[21] Appl. No.: 08/845,904

[22] Filed: Apr. 28, 1997

[30] Foreign Application Priority Data

Apr. 26, 1996 [JP] Japan .................................. 8-106980

[51] Int. Cl.[7] .............................. H04N 5/50; H04N 9/45; H03L 7/00
[52] U.S. Cl. .......................... 348/731; 348/505; 348/536; 455/191.1; 455/260; 455/265
[58] Field of Search .................... 348/731, 505, 348/536; 455/191.1, 260, 180.3, 265, 320, 188.1, 188.2, 189.1, 340; 334/85

[56] References Cited

U.S. PATENT DOCUMENTS

| | | | |
|---|---|---|---|
| 3,614,665 | 10/1971 | Weller et al. | 331/101 |
| 3,931,578 | 1/1976 | Girringer | 455/189.1 |
| 4,106,059 | 8/1978 | Henderson et al. | 348/731 |
| 4,145,659 | 3/1979 | Wolfram | 455/179.1 |
| 4,189,750 | 2/1980 | Sadel | 348/570 |
| 4,259,644 | 3/1981 | Iimura | 331/2 |
| 4,306,205 | 12/1981 | Ito et al. | 334/85 |
| 4,352,209 | 9/1982 | Ma | 455/315 |
| 4,399,419 | 8/1983 | Dobrovolny | 331/12 |
| 4,472,685 | 9/1984 | Dutasta | 329/325 |
| 4,520,507 | 5/1985 | Moon | 455/6.2 |
| 4,575,761 | 3/1986 | Carlson et al. | 348/731 |
| 4,581,643 | 4/1986 | Carlson | 348/731 |
| 4,691,378 | 9/1987 | Kumamoto et al. | 455/301 |
| 4,901,033 | 2/1990 | Herold et al. | 331/1 A |
| 4,901,036 | 2/1990 | Herold et al. | 331/25 |
| 4,905,087 | 2/1990 | Lupinetti | 348/731 |
| 5,034,695 | 7/1991 | Owen | 329/325 |
| 5,038,404 | 8/1991 | Marz | 455/118 |
| 5,179,729 | 1/1993 | Mishima et al. | 455/260 |
| 5,233,425 | 8/1993 | Rabii | 348/735 |
| 5,272,534 | 12/1993 | Vromans et al. | 348/731 |
| 5,280,644 | 1/1994 | Vannatta et al. | 455/265 |
| 5,311,318 | 5/1994 | Dobrovolny | 348/731 |
| 5,423,076 | 6/1995 | Westergren et al. | 455/86 |
| 5,457,817 | 10/1995 | Nagai et al. | 455/180.3 |
| 5,600,680 | 2/1997 | Mishima et al. | 375/327 |
| 5,739,874 | 4/1998 | Badger et al. | 348/731 |
| 5,774,194 | 6/1998 | Armbruster | 348/726 |
| 5,857,004 | 1/1999 | Abe | 375/344 |

FOREIGN PATENT DOCUMENTS 7-254865  10/1995  Japan .

*Primary Examiner*—John K. Peng
*Assistant Examiner*—Linus H. Lo
*Attorney, Agent, or Firm*—Pillsbury Madison & Sutro LLP

[57] ABSTRACT

A tuner circuit comprising a first frequency conversion means 14 for converting a high frequency input signal into a first intermediate frequency signal according to a first local oscillation signal, a second frequency conversion means 19 for converting the first intermediate frequency signal from the first frequency conversion means 14 into a second intermediate frequency signal according to a second local oscillation signal, a first PLL means 24 for controlling the first local oscillation signal so as to synchronize the phase of the signal with that of a reference oscillation signal having a fixed frequency, a second PLL means 31 for controlling the second local oscillation signal so as to synchronize the phase of the signal with that of a reference oscillation signal. In the first PLL means 24, a phase comparison frequency is set to a frequency higher than a specified value. In the second PLL means 31, a phase comparison frequency is set to a frequency lower than a specified value.

4 Claims, 6 Drawing Sheets

FIG.4

2nd Local Oscillator Counter vs 2nd Local Oscillator Frequency Variation

R : Reference Counter Division Ratio  (8~4095)
N : Main Counter Division Ratio  (16~2047)
A : Swallow Counter Division Ratio  (0~63, A < N)
Fcomp. : Comparison Frequency
    = 16000÷R  [kHz]
F (2LO) : 2nd Local Oscillator Frequency
    = [(64×N)+A]×16÷R  [MHz]
ΔF (2LO) : 2nd Local Oscillator Frequency Variation
    = - [F (2LO) - 1123]×1000  [kHz]
Total Counter : Local Oscillator Counter
    (Including Main Counter and Swallow Counter)

| R | N | A | Total Counter Division Ratio (64×N)+A | Fcomp. [kHz] | F (2LO) [MHz] | ΔF (2LO) [kHz] |
|---|---|---|---|---|---|---|
| 59 | 64 | 46 | 4142 | 271.2 | 1123.254 | -254 |
| 60 | 65 | 52 | 4212 | 266.7 | 1123.200 | -200 |
| 61 | 66 | 58 | 4282 | 262.3 | 1123.148 | -148 |
| 62 | 68 | 0 | 4352 | 258.1 | 1123.097 | -97 |
| 63 | 69 | 6 | 4422 | 254.0 | 1123.048 | -48 |
| 64 | 70 | 12 | 4492 | 250.0 | 1123.000 | 0 |
| 65 | 71 | 18 | 4562 | 246.2 | 1122.954 | +46 |
| 66 | 72 | 24 | 4632 | 242.4 | 1122.909 | +91 |
| 67 | 73 | 30 | 4702 | 238.8 | 1122.866 | +134 |
| 68 | 74 | 36 | 4772 | 235.3 | 1122.824 | +176 |
| 69 | 75 | 42 | 4842 | 231.9 | 1122.783 | +217 |
| 70 | 76 | 48 | 4912 | 228.6 | 1122.743 | +257 |

Reference Counter  [R]  Step = 1
Total Counter  [(64×N)+A]  Step = 70
2nd Local Oscillator Frequency Variation  [ΔF (2LO)]  Step = 40~54kHz

TUNER CIRCUIT

BACKGROUND OF THE INVENTION

1. Field of the Invention

The present invention relates to a twin phase locked loop control double super tuner circuit which is used to receive analog broadcasts and a digital broadcasts of a CATV (Cable Television) broadcasting system, satellite broadcasting system, and HDTV (High Definition Television) system using the UHF (Ultra High Frequency) band or the like.

2. Description of the Related Art

It is well known that a tuner which is used to receive analog broadcasts and digital broadcasts of a CATV broadcasting system, satellite broadcasting and HDTV broadcasting in system using the UHF band or the like, is usually called a double super tuner. Such tuner comprises two frequency converters and two local oscillators.

FIG. 6 shows the conventional double super tuner. In such a double super tuner, a high frequency signal S1 is applied to its input terminal 11. This high frequency signal S1 first passes through a wide-band Band Pass Filter 12 and is amplified by a Radio Frequency amplifier 13. The resulting high frequency signal S2 is fed to one input terminal of a first frequency converter 14. A first local oscillation signal S3 generated by a first local oscillator 15 is supplied to its other input terminal. The first frequency converter 14 mixes the high frequency signal S2 with the first local oscillation signal S3 to obtain a first intermediate frequency signal S4. That is, the first frequency converter 14 up-converts the high frequency signal S2 to a predetermined first intermediate frequency.

A balanced mixer is typically used as the first frequency converter 14. The first intermediate frequency signal S4 from the first frequency converter 14 is filtered by BPF 16 of the intermediate frequency band. The resulting first intermediate frequency S5 is amplified by an amplifier 17 and passes through a BPF 18. The BPF 18 is the same as the BPF 16 in this configuration. The first intermediate frequency signal S6 from the BPF 18 is fed to one input terminal of a second frequency converter 19. A second local oscillation signal S7 is supplied to the other input terminal of the second frequency converter 19 from a second local oscillator 20. The second frequency converter 19 mixes the first intermediate frequency signal S6 with the second local oscillation signal S7 to obtain a second intermediate frequency signal S8.

The second frequency converter 19 down-converts the first intermediate frequency signal S6 to a predetermined second intermediate frequency. The second intermediate frequency signal S8 from the second frequency converter 19 passes through a BPF 21 of the second intermediate frequency band and is amplified by an amplifier 22. The resulting signal is output from an output terminal 23.

The first local oscillator 15 stated above is controlled by a PLL circuit 24. That is, the first local oscillation signal S3 from the first local oscillator 15 is fed not only to the first frequency converter 14, but also to the PLL circuit 24. The PLL circuit 24 compares the phase of the oscillation signal by dividing the signal by n, then comparing the resulting signal with a signal resulting from the division of a reference oscillation signal, corresponding to a preset reference value, by m. The PLL circuit 24 generates a phase error signal S9 corresponding to the comparison result. The phase error signal S9 is converted into a tuning voltage level signal V1 by an active (Low Pass Filter(LPF) 25 and sent to the first local oscillator 15 in the form of a control voltage. Therefore, the first local oscillator 15 is so controlled that the oscillation frequency of the first local oscillation signal S3 becomes a frequency corresponding to the tuning voltage level signal V1 (that is, a frequency obtained by multiplying the reference oscillation signal frequency by n/m).

The second local oscillator 20 is controlled by an AFC (Automatic Frequency Control) voltage which is usually supplied to a terminal 26 from a video demodulating part (not shown).

In recent years, with the adoption of wide band for the CATV broadcasting system, hither frequencies have been used as the first intermediate frequency signal S4 to expand the receiving frequency range of the double super tuner. As a result, higher frequencies have been adopted for the local oscillators 15, 20, so the frequency fluctuation range with respect to a control voltage has become wider. Therefore, it has become difficult to control such frequency fluctuations. For this reason, instead of the conventional AFC for the second local oscillator 20, a twin PLL control double super tuner system which PLL-controls both the first local oscillator 15 and the second local oscillator 20 has been increasingly adopted. That is, the twin PLL control double super tuner system includes two frequency converters, two local oscillators and two PLL circuits.

To cope with digital TV broadcasting, the development of a low phase noise tuner (that is, a tuner with good phase noise characteristic) is in demand, one which can receive digitally modulated TV signals such as 16QAM (Quadrature Amplitude Modulation), 64QAM and 16VSB (Vestigial Side Band). Therefore, use of the twin PLL control double super tuner system is increasing. Especially, when as a CATV transmitter sends out both analog broadcasts wave and the digital broadcasts, so a CATV receiver tuner must be able to receive both broadcasts.

However, for the tuner of the conventional twin PLL control double super tuner type, high PLL phase comparison frequency is required to produce a tuner of low phase noise which can receive the digital broadcasts. In that case, the AFC does not work well at the reception of the analog broadcasts.

In the case of the tuner circuit of the conventional twin PLL control double super tuner type, if a reference oscillation injection line (pattern) is installed from a first PLL circuit to a second PLL circuit in the tuner in order to share a PLL reference oscillation signal from the first local oscillator 15 and the second local oscillator 20, the line is electomagnetically coupled with the surrounding circuits. As a result, the tuner is apt to produce adverse effects such as an electromagnetic wave radiation and noise intrusion from the environment.

As described above, where the tuner circuit of the conventional twin PLL control double super tuner type receives both the digital broadcasts wave and the analog broadcasts, a high PLL phase comparison frequency is required to obtain a tuner of good phase noise characteristic for the reception of the digital broadcast wave. In this case, the AFC does not work well for the reception of the analog broadcast wave. Installation of a reference oscillation signal injection line in the tuner to share the PLL reference oscillation signal from the first local oscillator and the second local oscillator causes electromagnetic coupling with the surrounding circuits. As results, adverse effects such as an electric wave radiation and a noise intrusion result.

SUMMARY OF THE INVENTION

An object of the present invention is to provide a simple, economic and highly efficient tuner of twin PLL control double super tuner type which can receive both the analog and digital broadcasts.

A twin PLL control double super tuner circuit according to the present invention comprises a first local oscillation means for generating a first local oscillation signal, a first frequency conversion means for converting a high frequency input signal into a first intermediate frequency signal according to the first local oscillation signal generated by the first local oscillation means, a second local oscillation means for generating a second local oscillation signal, a second frequency conversion means for converting the first intermediate signal from the first frequency conversion means into a second intermediate frequency signal according to the second local oscillation signal generated by the second local oscillation means, a first PLL means for controlling the first local oscillation signal generated by the first local oscillation means so as to synchronize the phase of the signal with that of a reference oscillation signal having a fixed frequency, and a second PLL means, which is interlocked with the first PLL means by the reference oscillation signal, for controlling the second local oscillation signal generated by the second local oscillation means so as to synchronize the phase of the signal with that of the reference oscillation signal.

In the first PLL means, a phase comparison frequency is set to a frequency higher than the specified frequency. In the second PLL means, a phase comparison frequency is set to a frequency lower than the specified frequency.

In this configuration, as described above, the phase comparison frequency in the first PLL means is set to a frequency higher than the specified value, so that the phase noise characteristics of the first local oscillation means can be improved, thereby improving the reception of digital broadcast. At the same time, the phase comparison frequency in the second PLL means is set to a frequency lower than the specified value, so highly accurate AFC becomes possible for the reception of the analog broadcasts.

A twin PLL control double super tuner circuit according to the present invention comprises a first local oscillation means for generating a first local oscillation signal, a first frequency conversion means for converting the high frequency input signal into a first intermediate frequency signal according to the first local oscillation signal generated by the first local oscillation means, a second local oscillation means for generating the second local oscillation signal, a second frequency conversion means for converting the first intermediate signal from the first frequency conversion means into the second intermediate frequency signal according to the second local oscillation signal generated by the second local oscillation means, a first PLL means, which controls the first local oscillation signal generated by the first local oscillation means so as to synchronize the phase of the signal with that of a reference oscillation signal having a fixed frequency, having a local oscillation counter to divide and count the first local oscillation signal and a reference counter to divide and count the reference oscillation signal, and a second PLL means, which is interlocked with the first PLL means by the reference oscillation signal and controls the second local oscillation signal generated by the second local oscillation means so as to synchronize the phase of the signal with that of the reference oscillation signal, having a local oscillation counter to divide and count the second local oscillation signal and a reference counter to divide and count the reference oscillation signal.

In case that the frequency is controlled with a frequency step width narrower than the phase comparison frequency by changing the local oscillation counter and the reference counter of at least one PLL means of the first and the second PLL means, the indications of both local oscillation counter and reference counter for the reference oscillation signal can be changed almost at the same time within the specified time.

In this configuration, if a malfunction occurs such that the local oscillation counter data or the reference counter data is changed, and thereby the frequency changes the remaining counter data is changed also, so that the frequency can be controlled with a frequency step width narrower than the phase comparison frequency.

In addition, a twin PLL control double super tuner circuit according to the present invention comprises a first local oscillation means for generating a first local oscillation signal, a first frequency conversion means for converting the high frequency input signal into the first intermediate frequency signal according to the first local oscillation signal generated by the first local oscillation means, a second local oscillation means for generating a second local oscillation signal, a second frequency conversion means for converting the first intermediate frequency signal from the first frequency conversion means into the second intermediate frequency signal according to the second local oscillation signal generated by the second local oscillation means, a first PLL means for controlling the first local oscillation signal generated by the first local oscillation means so as to synchronize the phase of the signal with that of the reference oscillation signal having a fixed frequency, a second PLL means, which is interlocked with the first PLL means by the reference oscillation signal for controlling the second local oscillation signal generated by the second local oscillation means so as to synchronize the phase of the signal with that of the reference oscillation signal, a reference oscillation signal coupling means for sharing the reference oscillation signal by the first and the second PLL means, and an accommodation unit for accommodating the reference oscillation signal coupling means with a plurality of feedthrough capacitors arranged at predetermined positions. In the accommodation unit, the reference oscillation signal coupling means is so arranged that its signal lead-out path is at a right angle to the feedthrough capacitor leads. In this arrangement, the electromagnetic coupling between them is less, so the adverse influences of the reference oscillation signal to the surrounding circuits can be mitigated.

BRIEF DESCRIPTION OF THE DRAWINGS

FIG. 4 is a table showing a phase comparison frequency ,etc. corresponding to the reference counter and the local oscillation counter in the embodiment shown in FIG. 3.

DETAILED DESCRIPTION OF THE PREFERRED EMBODIMENTS

An embodiment of the present invention will be described in detail with reference to the drawings.

Figure 1:
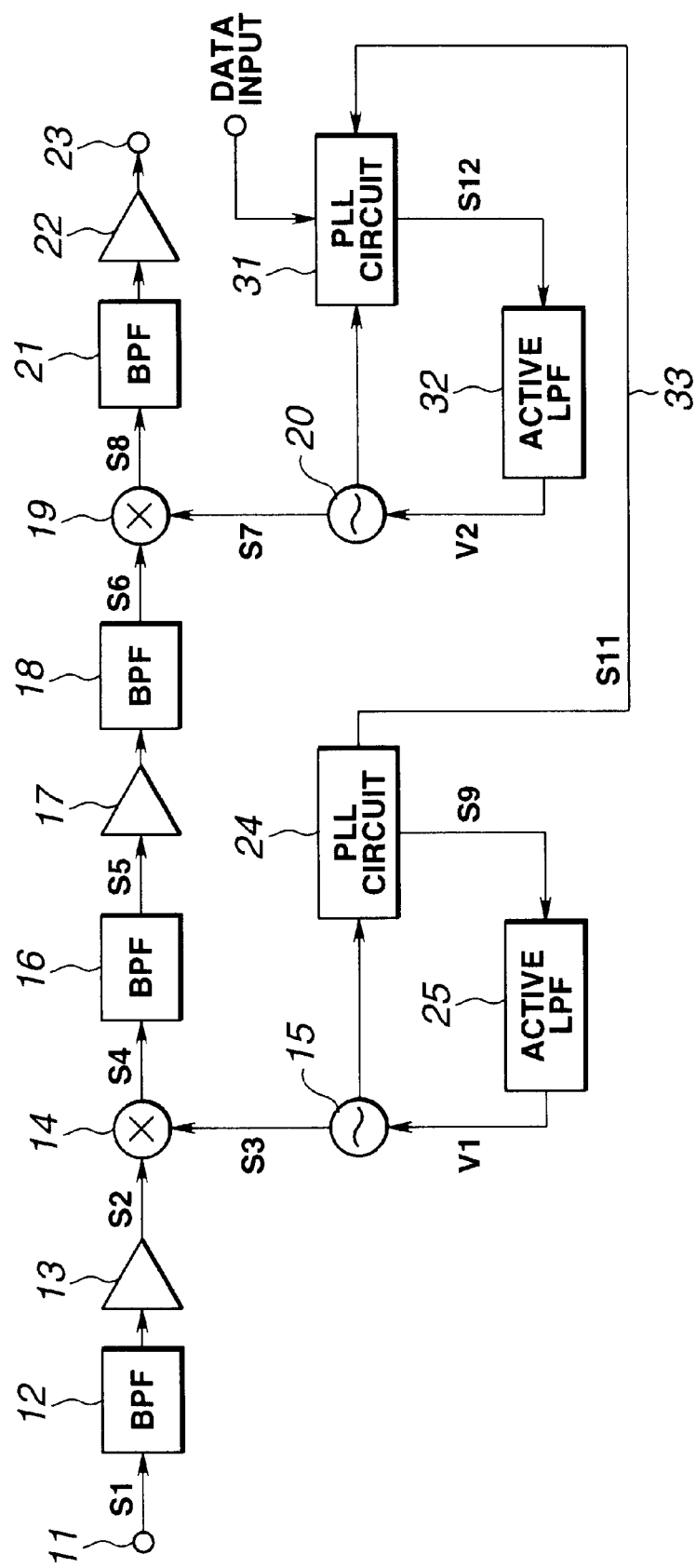
FIG. 1 is a block diagram of an embodiment of a twin PLL control double super tuner circuit according to the present invention.
Figure 6:
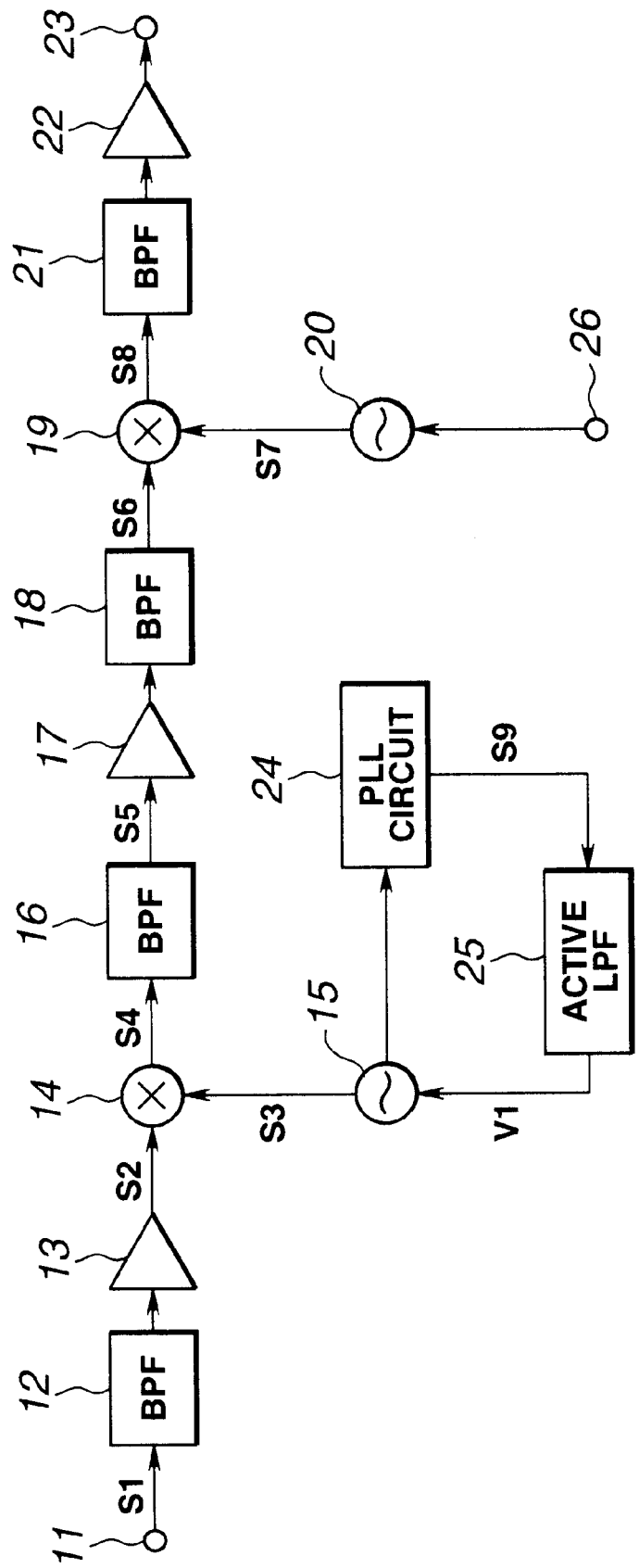
FIG. 6 is a block diagram of a conventional double super tuner.

FIG. 1 is an embodiment of the present invention. In FIG. 1, the same parts as those in FIG. 6 have the same reference number. The embodiment shown in FIG. 1 is identical to that shown in FIG. 6 except that the former applies the PLL control to a second local oscillator 20. A PLL circuit 31 connected with the second local oscillator 20 is coupled with a PLL circuit 24 connected with a first local oscillator 15 by an injection line 33 for the reference oscillation signal. Therefore, the PLL control for the second local oscillator 20 is performed together with the PLL control for the first local oscillator 15.

The first local oscillator 15 is controlled by the PLL circuit 24. That is, the first local oscillation signal S3 generated by the first local oscillator 15 is fed to both the first frequency converter 14 and the PLL circuit 24. The PLL circuit 24 compares the phase of a signal obtained by dividing the first local oscillation signal S3 by n with that of a signal obtained by dividing the reference oscillation signal corresponding to the preset reference value by m. The PLL circuit 24 generates a phase error signal S9 corresponding to the comparison result. The phase error signal S9 is converted into a tuning voltage level signal VI by an active LPF (Low Pass Filter) 25 and fed to the first local oscillator 15 as a control voltage. Therefore, the first local oscillator 15 is so controlled that the ostillation frequency of the first local oscillation signal S3 becomes a frequency corresponding to a tuning voltage level signal V1 (that is, a frequency obtained by multiplying the frequency of the reference oscillation signal by n/m).

That is, the second local oscillator 20 sends a second local oscillation signal S7 not only to the second frequency converter 19 but also to one input terminal of the PLL circuit 31. The PLL circuit 31 compares the phase of a signal obtained by dividing the second local oscillation signal S7 by n' with that of a signal obtained by dividing the reference oscillation signal S11 by m' which is supplied to the other input terminal of the PLL circuit from the PLL circuit 24 through the injection line 33. The PLL circuit 31 sends the phase error signal S12 corresponding to the comparison result to the active LPF 32. The phase error signal S12 is converted into a tuning voltage level signal V2 by the active LPF 32 and fed to the second local oscillator 20 as a control voltage. Therefore, the second local oscillator 20 is controlled such that the oscillation frequency of the second local oscillation signal S7 becomes a frequency corresponding to the tuning voltage level signal V2 (that is, a frequency obtained by multiplying the frequency of the reference oscillation signal by n'/m').

The phase comparison frequency of the PLL circuit 24 which controls the first local oscillator 15 is set to a higher frequency ($\geq 250$ kHz) by decreasing the dividing value m. At the same time, the phase comparison frequency of the PLL circuit 31 which controls the second local oscillator 20 is set to a lower frequency ($\leq 100$ kHz) by increasing the dividing value m'.

In this configuration, the change ratio of the oscillation frequency increases and the phase noise characteristic of the first local oscillator 15 is improved by setting the phase comparison frequency of the PLL circuit 24 to a higher value. As such, the tuner circuit can receive the digital broadcast wave. At the same time, the high precision AFC becomes possible for the reception of the analog broadcast wave by setting the phase comparison frequency of the PLL circuit 31 to a lower value and by changing, the oscillation frequency of the second local oscillator 20 with the same step as that of the phase comparison frequency. Originally, the second local oscillator 20, a fixed frequency oscillator can achieve a good phase noise characteristic relatively easily with small change ratio of the oscillation frequency for the PLL control. As such, a double super tuner can be obtained which can receive digital broadcasts with low phase noise characteristic and can perform the AFC for the reception of analog broadcast wave. To receive a digitally modulated wave such as 64QAM, the phase noise characteristic of the tuner should be as high as −80 dB (c)/Hz (10 kHz offset) or so. To achieve such high phase noise characteristic, it is necessary to set the phase comparison frequency of the PLL circuit 24 which controls the first local oscillator 15 at 250 kHz or higher. It is also necessary to set tie frequency precision by the AFC for the reception of the analog broadcast wave to the frequency error at least less than 100 kHz, judging from the Nyquist characteristic of a SAW filter in a demodulating part. This AFC is a digital AFC. This digital AFC sends an analog AFC voltage obtained from the AFC circuit in the demodulating part at the posterior stage in the circuit shown in FIG. 1 to a comparator. This comparator compares the above-mentioned analog AFC voltage with the reference voltage to determine if the former is higher or lower than the latter. A microcomputer (or a CPU). feeds back such comparison result to the PLL circuit 31 as digital data (discrete value) showing the present reception state. The oscillation frequency of the second local oscillator 20 is controlled step-wise according to such fed-back data so as to keep the frequency of the second intermediate signal S8 at the predetermined value at all times.

Figure 2:
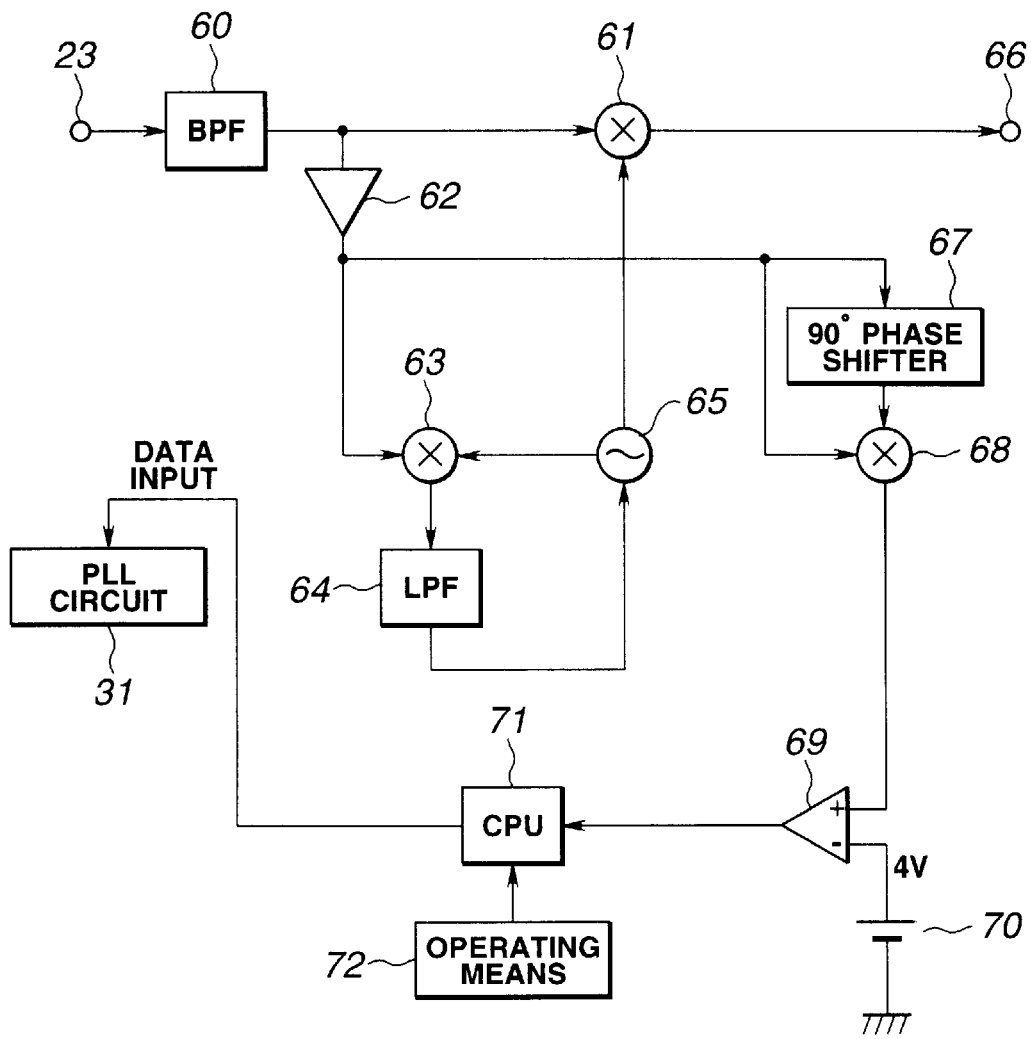
FIG. 2 is a block diagram of an example of an AFC loop used in the embodiment shown in FIG. 1.

FIG. 2 is an example of the AFC control loop. The second intermediate frequency signal from a terminal 23 is supplied to one input terminal of a synchronous detector 61 through a BPF 60 comprised of a SAW filter. The oscillation frequency signal of a VCO (Voltage controlled Oscillator) 65 which is locked at the input second intermediate frequency by the PLL is supplied to the other input terminal of the synchronous detector 61. That is, the second intermediate frequency signal is applied to one input terminal of the phase comparator 63 through a limiter amplifier 62, and the oscillation frequency signal of the VCO 65 is applied to the other input terminal of the phase comparator 63. The phase comparison output of the phase comparator 63 is smoothened by a LPF 64 and the resulting output is applied to the control terminal of the VCO 65. As a result, the VCO 65 oscillates a frequency signal locked at the second intermediate frequency and supplies a signal to the other input terminal of the synchronous detector 61. The synchronous detector 61 performs a multiplication detection of two frequency signals and its detection output is applied to the output terminal 66. Furthermore, the phase of the output signal (the second intermediate frequency signal) of a limiter amplifier 62 is shifted by 90 degrees by a phase shifter 67 at the second intermediate frequency. The resulting signal is then applied to one input terminal of a phase comparator 68. Meantime, the output signal from the limiter amplifier 62 is applied to the other input terminal of the phase comparator 68. When the phase difference between two input signals is 90 degrees exactly, the phase comparator 68 outputs 4V for example as the phase comparison output. Therefore, if the phase difference between two signals to be applied to the phase comparator 68 deviates from 90 degrees due to the variation of the frequency of the second intermediate frequency signal from the BPF 60, the phase comparison output of the phase comparator 68 deviates from 4V upward or downward. If the frequency of the second intermediate frequency signal varies and the phase difference between two input signals for the phase comparator 68 exceeds 90 degrees, the phase comparison output from the phase comparator 68 exceeds 4V. Such a phase comparison output is compared with the reference value of 4V of a reference voltage source 70. As a result, the logical level "1" is outputted. When this logical level "1" is detected by a CPU 71, the CPU 71 changes the data input (frequency division ratio data) for the PLL circuit 31 and changes the oscillation frequency of the second local oscillator 20 based on the above-mentioned change of the data input to control the frequency to prevent the frequency variation of the second intermediate frequency signal. Meanwhile, a signal from a operating means 72 for channel selection etc., is applied to the CPU 71. At the start of the reception of a broadcast signal (for example, when a power switch is turned on), the CPU 71 sends channel selection data corresponding to a channel selected by the operating means 72 to the PLL circuit 31. As a result, when the channel selected is received, the CPU 71 checks the frequency of the second intermediate frequency signal by the above-mentioned AFC control loop and controls so as to keep the second intermediate frequency at the predetermined value.

Figure 3:
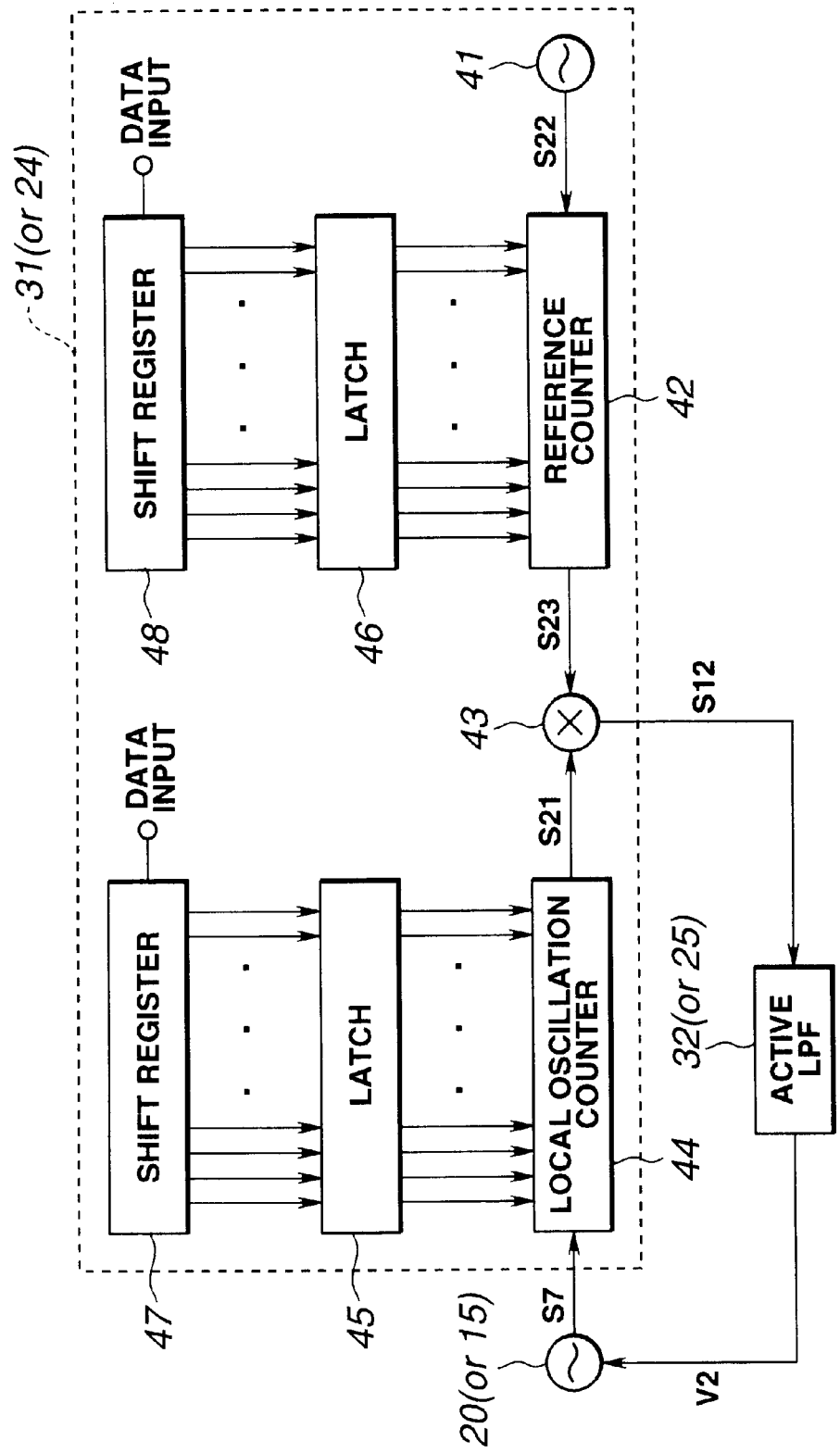
FIG. 3 is a block diagram showing a PLL circuit in detail in the embodiment shown in FIG. 1.

FIG. 3 is the detailed configuration of the above-mentioned PLL circuit 24, 31 shown in FIG. 1. The PLL circuit 31 comprises a reference oscillator 41, a reference counter 42, a phase comparator 43, a local oscillation counter 44, latches 45, 46 and shift registers 47, 48.

The second local oscillation signal S7 from the second oscillator 20 is divided by the local oscillation counter 44. At that time, frequency division ratio control data is supplied to the local oscillation counter 44. Such data is outputted from the shift register 47 through the latch 45. That is, the local oscillation counter 44 divides the second local oscillation signal S7 by (n') according to the frequency division ratio control data. The divided signal S21 is sent to one input terminal of the phase comparator 43. It is preferable that the local oscillation counter 44 include a main counter and a swallow counter.

The reference oscillator 41 generates a reference oscillation signal S22 having a fixed frequency and supplies such signal to the reference counter 42. The reference counter 42 divides the reference oscillation signal S22. At that time, a frequency division ratio control data is applied to the reference counter 42. Such data is outputted from the shift register 48 through the latch 46. That is, the reference counter 42 divides the reference oscillation signal S22 by (m') according to the frequency division ratio control data. The divided signal S23 is sent to the other input terminal of the phase comparator 43.

The phase comparator 43 compares the phase of the signal 21 from the local oscillation counter 44 with that of the signal S23 from the reference counter 42 and outputs a phase error signal S12 corresponding to the comparison result to the active LPF 32. The phase error signal S12 is converted to a tuning voltage level signal V2 by the active LPF 32 and the converted signal is sent to the second local oscillator 20.

The latches 45, 46 transfer the frequency division ratio control data from the shift registers 47, 48 to the local oscillation counter 44 and the reference counter 42 almost at the same time, so as to chance frequency division ratio control data for both the local oscillation counter 44 and the reference counter 42. Such operation can be achieved by a PLL circuit which can read the data for the local oscillation counter 44 and the reference counter 42 as one serial data string. Such operation can also be achieved by a PLL circuit equipped with a so-called counter buffer which can control the timing simultaneously or not simultaneously when the shift registers 47, 48 transfer the frequency division ratio control data to the latch 45 of the local oscillation counter 44 and the latch 46 of the reference counter 42.

Such operation can also be achieved by reading the frequency division ratio control data from both the local oscillation counter 44 and the reference counter 42 from the shift registers 47, 48 at such high speed that such data is read within ⅕ or less of the time constant of the active LPFs 25, 32 of the PLL.

The local oscillator 20 control procedure will be described below which is controlled by the PLL circuit 31 so as to change the local oscillation frequency by a frequency step width narrower than the comparison frequency with reference to the table in FIG. 4.

FIG. 4 shows a frequency change by controlling three counters, namely, the reference counter R, the main counter n and the swallow counter A simultaneously, showing the control condition that the reference counter 42 is set to 64 and the comparison frequency is 250 kHz, as a center.

It is clear from FIG. 4 that the local oscillation frequency can be controlled with a frequency step width of about 50 kHz in spite of the comparison frequency of about 250 kHz.

In such configuration, in case that the frequency is controlled with a frequency step width narrower than the phase comparison frequency by changing both local oscillation counter 44 and reference counter 42 of at least one PLL circuit of the PLL circuits 24, 31 of the first local oscillator 15 or the second local oscillator 20, the counter data of both the local oscillation counter 44 and the reference counter 42 are changed almost at the same time (within the time sufficiently shorter than the time constant of the active LPFs 25, 32 of the PLL). Therefore, if a malfunction occurs such that "after either the local oscillation counter 44 data or the reference counter 42 data is changed and thereby the frequency changes greatly, the remaining counter data is changed, so that the frequency can be controlled with a frequency step width narrower than the phase comparison frequency, but the AFC does not work well due to a great change of the frequency on the way" can be prevented.

Figure 5A:
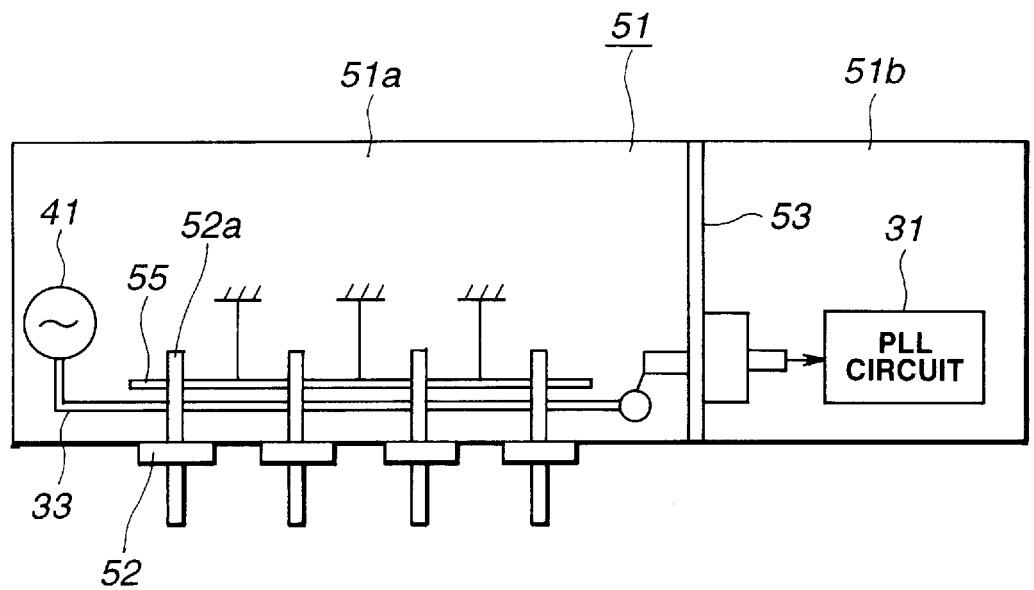
FIG. 5(a) is a plan view for the description of the layout of the injection line for the reference oscillation signal in the embodiment shown in FIG. 1.
Figure 5B:
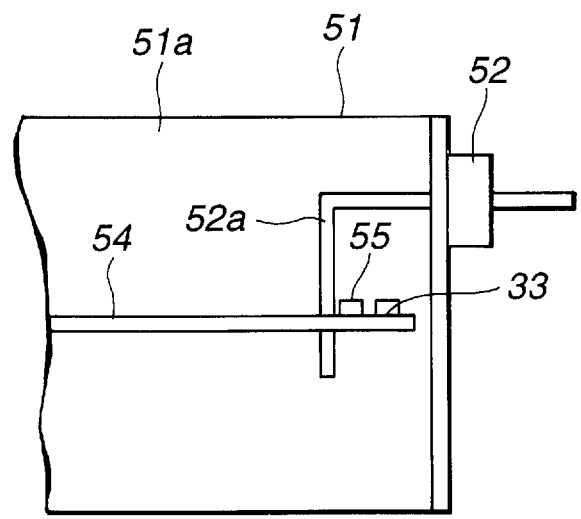
FIG. 5(b) is a side view of the main parts of the injection line shown in FIG. 5(a).

FIGS. 5(*a*) and (*b*) show a layout of the injection line 33 of the reference oscillation signal S1 in the PLL circuits 24, 31 of an embodiment in FIG. 1. FIG. 5(*a*) is a plan view of the chassis 51 containing the PLL circuits 24, 31. FIG. 5(*b*) is a side view of the main parts of the chassis 51 shown in FIG. 5(*a*).

On a side of the chassis 51, a plurality of feedthrough capacitors 52 are arranged as specified exposedly. In addition, the chassis is divided by a sheet-like shield plate 53 into an up-converter section 51*a* containing a plurality of feedthrough capacitors 52 and a down-converter section 51*b*. The leads 52*a* of these feedthrough capacitors 52 are connected with a PCB (Polychlorinated Biphenyl) board 54 (see FIG. 5(*b*)) in the chassis 51. The up-converter 51*a* includes the reference oscillator 41, the injection line 33, and an earth line 55. The down-converter 51*b* contains a PLL circuit 31 of the second local oscillator 20, for example.

As shown in FIG. 5(*b*), in the up-converter 51*a*, the injection line 33 is arranged below the leads 52*a* of a plurality of feedthrough capacitors 52 at a right angle to these leads 52*a*. This injection line 33 has a reference oscillator 41 at one end and a PLL circuit 31 at the other end.

In this configuration, the electromagnetic coupling between the injection line 33 and the leads of the feedthrough capacitors 52 can be decreased by arranging the injection line 33 as the reference oscillation signal connection pattern to share the reference oscillation signal S11 at an almost right angle to the leads of the feedthrough capacities 52. As a result, interference by the reference oscillation signal S11 can be mitigated. Since the PLL circuit 31 can be isolated from other circuits by the shield plate 52, other circuits are protected from electric wave radiation and the PLL circuit 31 is protected from the intrusion of unnecessary electric waves.

In the up-converter 51*a*, an earth line 55 is arranged in parallel with the injection line 33 between the injection line 33 and the leads of a plurality of feedthrough capacitors 52. The leads are electrically connected with the earth line 55 through the PCB board 54. Therefore, electromagnetic coupling between the injection line 33 and the leads of the feedthrough capacitors 52 as well as other circuits can be decreased, so the adverse influences of the reference oscillation signal S11 can be improved.

As described above, each embodiment of the present invention has a simple circuit configuration in which the first and the second local oscillators 15, 20 share the reference oscillation signal S11 of the PLL circuits 24, 31 and each PLL circuit 24, 31 can set the phase comparison frequency respectively. Therefore, a highly efficient PLL circuit can be achieved more economically without requiring any additional parts, IC memory, or the like.

According to the present invention, a simple, economic and highly efficient twin PLL control double super tuner circuit can be achieved which can receive both the analog broadcast wave and the digital broadcast wave.

The present invention is not limited by above-mentioned embodiments and various variations and modifications can be achieved without departing from the spirit and scope of the invention.

What is claimed is:

1. A twin PLL control double super tuner circuit comprising:
    a first local oscillation means for generating a first local oscillation signal;
    a first frequency conversion means for converting a high frequency input signal into a first intermediate frequency signal according to said first local oscillation signal generated by said first local oscillation means;
    a second local oscillation means for generating a second local oscillation signal;
    a second frequency conversion means for converting a first intermediate frequency signal from said first frequency conversion means into a second intermediate frequency signal according to a second local oscillation signal generated by said second local oscillation means;
    a first PLL means for controlling said first local oscillation signal generated by said first local oscillation means so as to synchronize the phase of the first local oscillation signal with that of a reference oscillation signal having a fixed frequency; and
    a second PLL means, which is interlocked with said first PLL means by said reference oscillation signal, for controlling said second local oscillation signal generated by said second local oscillation means so as to synchronize the phase of the second local oscillation signal with that of said reference oscillation signal;
    wherein a phase comparison frequency is set to a frequency higher than a first specified frequency in said first PLL means and the phase comparison frequency is set to a frequency lower than a second specified frequency in said second PLL means, the first specified frequency being higher than the second specified frequency.

2. A twin PLL control double super tuner circuit comprising:
    a first local oscillation means for generating a first local oscillation signal;
    a first frequency conversion means for converting the high frequency input signal into a first intermediate frequency signal according to a first local oscillation signal generated by said first local oscillation means;
    a second local oscillation means for generating a second local oscillation signal;
    a second frequency conversion means for converting the first intermediate frequency signal from said first frequency conversion means into a second intermediate frequency signal according to a second local oscillation signal generated by said second local oscillation means;
    a first PLL means, which controls said first local oscillation signal generated by said first local oscillation means so as to synchronize the phase of the first local oscillation signal with that of a reference oscillation signal having a fixed frequency, having a local oscillation counter to divide and count said first local oscillation signal and a reference counter to divide and count said reference oscillation signal; and
    a second PLL means, which is interlocked with said first PLL means by said reference oscillation signal and controls said second local oscillation signal generated by said second local oscillation means so as to synchronize the phase of the second local oscillation signal with that of said reference oscillation signal, having a local oscillation counter to divide and count said second local oscillation signal and a reference counter to divide and count said reference oscillation signal;
    wherein when a frequency of a particular one of the first and second local oscillation means is controlled with a frequency step width narrower than a phase comparison frequency associated with the particular one oscillation means by changing a local oscillation counter and a reference counter of a particular PLL means of said first and second PLL means which controls the particular one oscillation means, indications of both said local oscillation counter and said reference counter of the particular PLL means can be changed at substantially the same time within a specified time.

3. A twin PLL control double super tuner circuit comprising:
    a first local oscillation means for generating a first local oscillation signal;
    a first frequency conversion means for converting a high frequency input signal into a first intermediate frequency signal according to the first local oscillation signal generated by the first local oscillation means;
    a second local oscillation means for generating a second local oscillation signal;
    a second frequency conversion means for converting a first intermediate frequency signal outputted from the first frequency conversion means into a second intermediate frequency signal according to a second local oscillation signal generated by the second local oscillation means;
    a first PLL means for controlling the first local oscillation signal generated by the first local oscillation means so as to synchronize the phase of such signal with that of a reference oscillation signal having a fixed frequency;
    a second PLL means, which is interlocked with the first PLL means by the reference oscillation signal, for controlling the second local oscillation signal generated by the second local oscillation means so as to synchronize the phase of such signal with that of the reference oscillation signal;

a reference oscillation signal coupling means for sharing the reference oscillation signal between the first and the second PLL means; and an accommodation unit for accommodating the reference oscillation signal coupling means with a plurality of feedthrough capacitors arranged at predetermined positions;

wherein said reference oscillation signal coupling means is so arranged that a signal lead-out path of the reference oscillation signal coupling means is substantially at a right angle to leads of the feedthrough capacitors in said accommodation unit.

4. The twin PLL control double super tuner circuit of claim 3 characterized in that an earth pattern is arranged between the reference oscillation signal coupling means and the feedthrough capacitor leads in the accommodation unit.

* * * * *